United States Patent [19]

Iwakura et al.

[11] Patent Number: 4,542,339
[45] Date of Patent: Sep. 17, 1985

[54] CATHODE RAY OSCILLOSCOPE WITH A WAVEFORM STORAGE CAPABILITY

[75] Inventors: Mitsuo Iwakura, Ichikawa; Toru Takahashi, Wako; Kensaku Ono, Yokosuka, all of Japan

[73] Assignee: Iwatsu Electric Co., Ltd., Tokyo, Japan

[21] Appl. No.: 516,860

[22] Filed: Jul. 25, 1983

[30] Foreign Application Priority Data

Aug. 2, 1982 [JP] Japan ................... 57-135005

[51] Int. Cl.⁴ .................. G01R 13/20; H01J 29/50
[52] U.S. Cl. ...................... 324/121 R; 315/9; 328/124
[58] Field of Search .......... 324/121 R; 328/123, 328/124, 162; 315/8.61, 9, 13.11, 370

[56] References Cited

U.S. PATENT DOCUMENTS 3,337,766  8/1967  Malaby .................. 328/124

FOREIGN PATENT DOCUMENTS 56-40763  4/1981  Japan .................. 324/121 R

Primary Examiner—Ernest F. Karlsen
Attorney, Agent, or Firm—Woodcock, Washburn, Kurtz, Mackiewicz & Norris

[57] ABSTRACT

A CRO comprising a scan converter storage tube for storing the input waveform, and a CRT for displaying the input waveform received either directly from the signal input of the instrument or via the storage tube. As the center-to-center distance between the vertical and horizontal deflection plates of the storage tube unavoidably differs from the center-to-center distance between the vertical and horizontal deflection plates of the CRT, the input waveform is displayed in horizontally different positions on the CRT screen depending upon whether it is fed directly from the signal input or has been stored in the storage tube. In order to minimize this horizontal positional difference a position corrector circuit is provided which puts out a correction signal in proportion with a horizontal sweep speed determined by a sweep speed selector switch built into a sweep generator in a horizontal deflection circuit. In a preferred embodiment the correction signal is added to the sawtooth sweep signal put out by the sweep generator when the input waveform is being written on the storage tube. Additional embodiments are disclosed.

8 Claims, 17 Drawing Figures

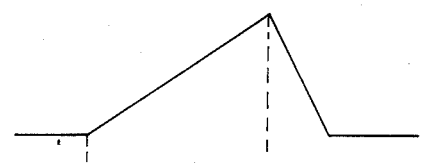
FIG. 3A  HORIZONTAL DEFLECTION SAWTOOTH
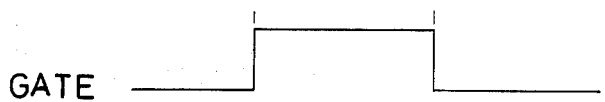
FIG. 3B  GATE
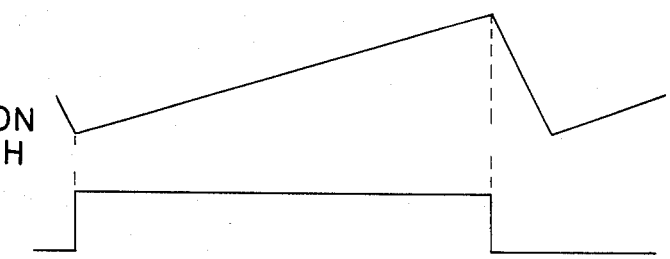
FIG. 4A  VERTICAL DEFLECTION SAWTOOTH
FIG. 4B  GATE
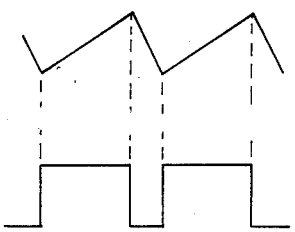
FIG. 5A  HORIZONTAL DEFLECTION SAWTOOTH
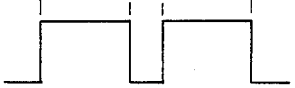
FIG. 5B  GATE

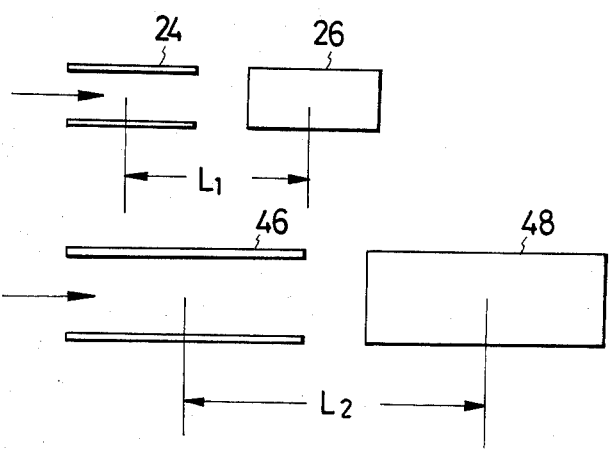
FIG. 6
FIG. 7
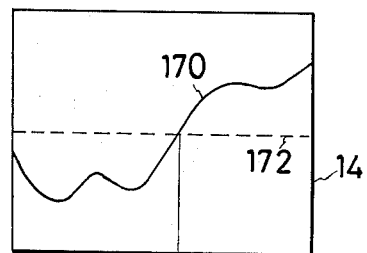
FIG. 8A
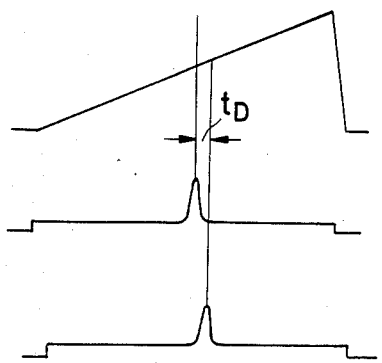
FIG. 8B
FIG. 8C
FIG. 8D

CATHODE RAY OSCILLOSCOPE WITH A WAVEFORM STORAGE CAPABILITY

BACKGROUND OF THE INVENTION

Our invention relates generally to cathode ray oscilloscopes (CROs) and pertains more specifically to a CRO of the class comprising a scan converter storage tube (hereinafter referred to simply as the storage tube) and a cathode ray tube (CRT).

The combination of a storage tube and a CRT together with associated control circuitry constitutes, per se, a known system, such that signal waveforms for observation or measurement can be introduced (written) into the storage tube for later extraction (reading) and display on the screen of the CRT.

Our Japanese Patent Application No. 54-117525, laid open to public inspection as 56-40763 on Apr. 17, 1981, represents an example of CRO with a built-in storage tube. In this prior art CRO the storage tube and CRT share a vertical and a horizontal amplifier. The parallel connection of the storage tube and CRT makes possible the use of the CRO in the following modes:

1. The direct display of the input waveform on the CRT screen, not via the storage tube, as is the case with ordinary CROs.
2. The indirect display of the input waveform on the CRT screen after its writing onto, and reading from, the storage tube.
3. The display of the input waveform on the CRT screen at the same time with its writing onto the storage tube.

In short the waveform being exhibited on the CRT screen may have either passed or bypassed the storage tube. We have found that our earlier CRO has a problem in connection with the display positions on the CRT screen of a waveform direct from the signal input of the instrument and that read from the storage tube. The CRT screen should give an exact replica of the input waveform in the same position thereon regardless of whether it is direct from the signal input or has been stored in the storage tube.

Our earlier CRO, however, displays one and the same waveform in horizontally displaced positions on the CRT screen depending upon whether it has passed or bypassed the storage tube, if the center-to-center distance between the pair of vertical deflection plates and pair of horizontal deflection plates of the CRT differs from the center-to-center distance between the pair of vertical deflection plates and pair of horizontal deflection plates of the storage tube, as will be later explained in further detail. Since some difference between these distances is customary, the above problem needs some practical solution.

SUMMARY OF THE INVENTION

Our present invention succeeds, in a CRO of the kind in question, in displaying the input waveform in substantially the same position on the CRT screen regardless of whether it is direct from the signal input or has been stored in the storage tube, in the face of the dimensional difference between the deflection system of the CRT and that of the storage tube.

Stated in brief, the improved CRO in accordance with our invention comprises a storage tube, a CRT, a first (e.g. vertical and a second (e.g. horizontal) deflection circuit, and a beam control circuit. The two deflection circuits and the beam control circuit control the writing and reading of the input waveform onto and from the storage tube, and the display by the CRT of the waveform that has either been fed directly from the signal input of the CRO or read from the storage tube. Also included is a position corrector circuit for eliminating the difference between the (horizontal) positions on the CRT screen of the waveform displayed thereon by being fed directly from the signal input and of the waveform displayed by being read from the storage tube. The position corrector circuit puts out a correction signal, for delivery to the second deflection circuit, which has a magnitude determined in accordance with a sweep speed selected by sweep speed selector means associated with the second deflection circuit.

The second deflection circuit utilizes the received correction signal for correspondingly shifting, normally in a horizontal direction, the position of the waveform being written onto the storage tube or, alternatively, being displayed on the CRT screen. Thus, at practically any selected sweep speed, the input waveform is displayed in substantially the same position on the CRT screen regardless of whether it is direct from the signal input or has been stored in the storage tube.

The above and other features and advantages of our invention and the manner of attaining them will become more apparent, and the invention itself will best be understood, from a study of the following description and appended claims, with reference had to the attached drawings showing some preferable embodiments of our invention.

BRIEF DESCRIPTION OF THE DRAWINGS

FIGS. 3A and 3B are both waveform diagrams plotting the outputs from the sweep generator included in the horizontal deflection circuit of FIG. 2;

FIGS. 4A and 4B are both waveform diagrams plotting the outputs from the vertical raster scan signal generator included in the vertical deflection circuit of FIG. 2;

FIGS. 5A and 5B are both waveform diagrams plotting the outputs from the horizontal raster scan signal generator included in the horizontal deflection circuit of FIG. 2;

FIG. 6 is a diagrammatic elevation of the deflection system of the scan converter storage tube included in the CRO of FIG. 1;

FIG. 7 is a similar diagram of the deflection system of the CRT included in the CRO of FIG. 1;

FIGS. 8A, 8B, 8C and 8D are waveform diagrams explanatory of a time delay introduced during waveform transfer from storage tube to CRT in the CRO of FIG. 1;

DESCRIPTION OF THE PREFERRED EMBODIMENTS

Figure 1:
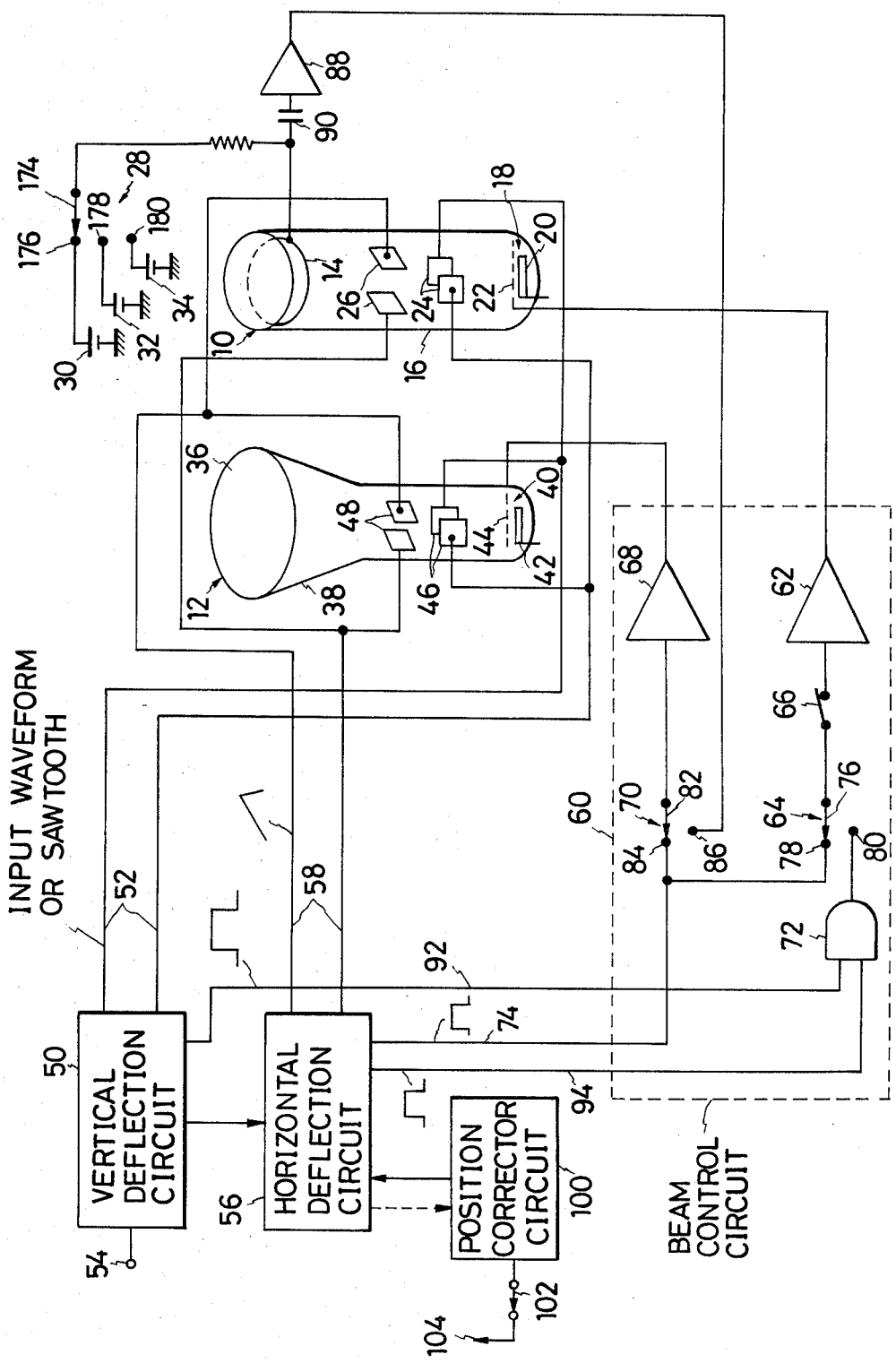
FIG. 1 is a schematic electrical diagram, partly in block form, of the CRO with a waveform storage function constructed in accordance with the principles of our invention.

Reference is first directed to FIG. 1 in order to describe the general organization of the exemplified CRO with a waveform storage capability in accordance with our invention. It comprises a scan converter storage tube 10 for the storage of the input waveform and a CRT 12 for the display of the input waveform. The major components of the storage tube 10 are:

1. A storage target 14 adjacent one end of an envelope 16.

2. An electron gun 18 adjacent the opposite end of the envelope 16 having a cathode 20 and control grid 22 for emitting an electron beam directed toward the storage target 14.

3. A first pair of deflection plates 24 for deflecting the beam emitted by the electron gun 18 in a first direction.

4. A second pair of deflection plates 26 for deflecting the beam in a second direction at right angles with the first direction.

In the illustrated embodiment the first pair of deflection plates 24 deflects the beam vertically, and the second pair of deflection plates 26 horizontally. We will therefore call the first pair of deflection plates 24 the vertical deflection plates, and the second pair of deflection plates 26 the horizontal deflection plates.

The storage target 14 of the storage tube 10 includes a storage layer or substrate of sheetlike form with a collector electrode regularly patterned thereon, both not shown because of their conventional nature. We assume that the storage tube 10 includes other usual components, not shown, such as an accelerating grid, focusing electrode, astigmatism electrode, collimation electrode, and field mesh. For further details of the storage tube 10 reference is directed to Kato et al. U.S. Pat. No. 4,215,288 dated July 29, 1980.

Associated with the storage tube 10 is a supply switch 28 for selective connection of three power supplies 30, 32 and 34 to the storage target 14. These power supplies 30, 32 and 34 apply to the storage target 14 the voltages required for storage tube operation in the write, read, and erase modes, respectively. A reference to the aforesaid U.S. Pat. No. 4,215,288 or to Kato et al. U.S. Pat. No. 4,288,720 dated Sept. 8, 1981, will make clear how the storage tube 10 operates for writing, reading, and erasing input waveforms on and from the storage target 14.

The CRT 12 for the display of input waveforms, which have either been stored in the storage tube 10 or bypassed the same, is shown to comprise:

1. A display screen 36 adjacent one end of an envelope 38.

2. An electrode gun 40 adjacent the opposite end of the envelope 38 having a cathode 42 and a control grid 44 for emitting an electron beam directed toward the display screen 36.

3. A first pair of deflection plates 46 for deflecting the beam from the electron gun 40 in a first direction.

4. A second pair of deflection plates 48 for deflecting the beam from the electron gun 40 in a second direction at right angles with the first direction.

Like the two pairs of deflection plates 24 and 26 of the storage tube 10, the first pair of deflection plates 46 deflects the beam vertically, and the second pair of deflection plates 48 horizontally, in this particular embodiment. We will therefore call the first pair of deflection plates 46 the vertical deflection plates, and the second pair of deflection plates 48 the horizontal deflection plates.

We understand that the CRT 12 additionally comprises another grid, three anodes, and like standard components. We also assume that the vertical and horizontal deflection sensitivities of the storage tube 10 and CRT 12 closely approximate each other.

The pair of vertical deflection plates 24 of the storage tube 10 and the pair of vertical deflection plates 46 of the CRT 12 are connected in parallel with each other and are further coupled to a first or vertical deflection circuit (Y axis circuit) 50 by way of a pair of lines 52. A signal input terminal 54 is coupled directly to the vertical deflection circuit 50. The functions of the vertical deflection circuit 50 are:

1. To deliver the amplified replica of the input waveform, received through the signal input terminal 54, to both pairs of vertical deflection plates 24 and 46 of the storage tube 10 and CRT 12.

2. To apply raster scan sawtooth voltages to both pairs of vertical deflection plates 24 and 46 at the time of waveform readout from the storage tube 10 and display on the CRT screen 36.

The pair of horizontal deflection plates 26 of the storage tube 10 and the pair of horizontal deflection plates 48 of the CRT 12 are likewise interconnected in parallel and are coupled to a second or horizontal deflection circuit (X axis circuit) 56 by way of a pair of lines 58. Among the functions of the horizontal deflection circuit 56 are:

1. To apply sawtooth sweep voltages to both pairs of horizontal deflection plates 26 and 48 of the storage tube 10 and CRT 12 during the introduction of the input waveform into storage tube and CRT.

2. To apply raster scan sawtooth voltages to both pairs of horizontal deflection plates 26 and 48 at the time of waveform readout from the storage tube 10 and display on the CRT screen 36.

The horizontal deflection circuit 56 has provisions for changes in sweep speed. It can produce any desired one of several different sawtooth sweep signals corresponding to various sweep speeds. We will later discuss this sweep speed change function of the horizontal deflection circuit 56 in greater detail.

A beam control circuit (Z axis circuit) 60 is connected between the control grids 22 and 44 of the storage tube 10 and CRT 12 and the vertical 50 and horizontal 56 deflection circuits. The beam control circuit 60 comprises:

1. A first Z axis amplifier 62 having its input connected to the horizontal deflection circuit 56 via a selector switch 64 and on-off switch 66 and having its output connected to the control grid 22 of the storage tube 10.

2. A second Z axis amplifier 68 having its input connected to the horizontal deflection circuit 56 and to the storage target 14 of the storage tube 10 via a selector switch 70 and its output connected to the control grid 44 of the CRT 12.

3. An AND gate 72 having two inputs connected respectively to the vertical 50 and horizontal 56 deflection circuits and having its output connected to the first Z axis amplifier 62 via the selector switch 64.

The output line 74 of the horizontal deflection circuit 56, connecting the same to the two Z axis amplifiers 62 and 68 of the beam control circuit 60, is for the transmission of a sweep gate signal in the form of a rectangular wave representative of horizontal sweep periods. The selector switch 64 has a movable contact 76 connected to the first Z axis amplifier 68 via the on-off switch 66 and selectively engageable with a first fixed contact 78 connected to the output line 74 of the horizontal deflection circuit 56, and with a second fixed contact 80 connected to the output of the AND gate 72. The on-off switch 66 is to be opened for blocking the emission of the electron beam by the electron gun 18 of the storage tube 10.

The selector switch 70 has a movable contact 82 coupled directly to the input of the second Z axis amplifier 68. This movable contact is selectively engageable with a first fixed contact 84 connected to the output line 74 of the horizontal deflection circuit 56 and with a second fixed contact 86 connected to the storage target 14 of the storage tube 10 via an amplifier 88 and capacitor 90.

Coupled to the two inputs of the AND gate 72 and an output line 92 of the vertical deflection circuit 50 and an output line 94 of the horizontal deflection circuit 56. The vertical deflection circuit output line 92 is for the transmission of a vertical sweep gate signal in the form of a rectangular wave representative of vertical scanning periods from a vertical raster scan signal generator 96, FIG. 2, included in the vertical deflection circuit 50. The horizontal deflection circuit output line 94 is for the transmission of a horizontal sweep gate signal in the form of a rectangular wave representative of horizontal scanning periods from a horizontal raster scan signal generator 98, FIG. 2, included in the horizontal deflection circuit 56.

Accordingly the AND gate 72 puts out a Z axis signal only when both of its inputs are simultaneously energized by the vertical and horizontal sweep gate signals. Amplified by the first Z axis amplifier 62, the Z axis signal is delivered to the control grid 22 of the storage tube 10 for beam emission, provided that the movable contact 76 of the selector switch 64 is in engagement with the second fixed contact 80 and that the on-off switch 66 is closed.

FIG. 1 further shows in block form a position corrector circuit 100 constituting a feature of our invention. Associated with the horizontal deflection circuit 56, the position corrector circuit 100 functions to correct the difference between the display positions on the CRT screen 36 of the waveform direct from the signal input terminal 54 and of the waveform that has been written onto and read from the storage tube 10. The correction signal put out by the position corrector circuit 100 is to change in magnitude with the sweep speed selected by the noted means included in the horizontal deflection circuit 56.

In this particular embodiment the position corrector circuit 100 needs to operate only during the writing of the input waveform onto the storage tube 10. Provided for such controlled operation of the position corrector circuit 100 is an on-off switch 102 interposed between this circuit and its power supply 104.

Figure 2:
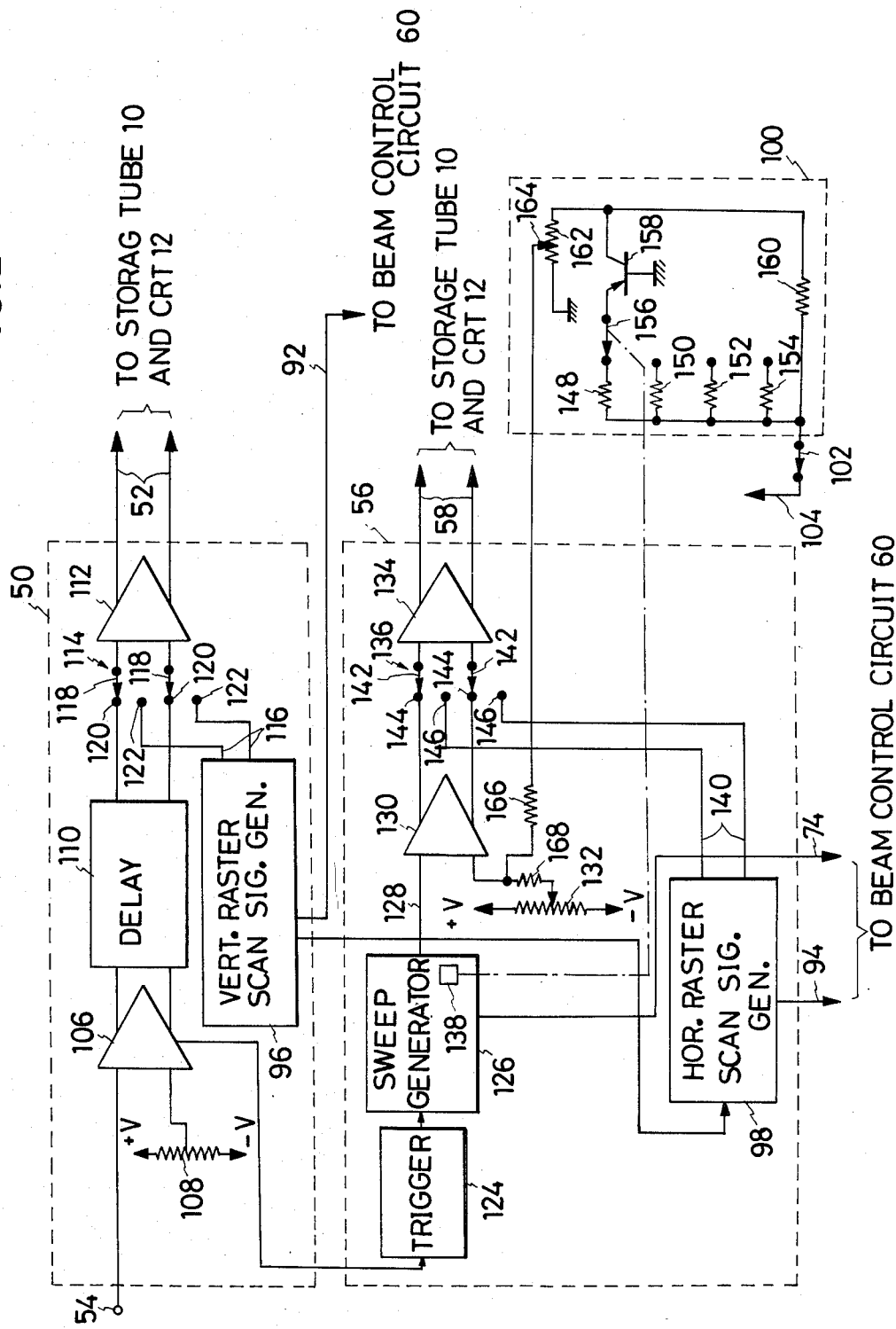
FIG. 2 is a schematic electrical diagram showing in detail the vertical and horizontal deflection circuits and position corrector circuit which are given in block form in FIG. 1.

FIG. 2 is a more detailed representation of the vertical deflection circuit 50, horizontal deflection circuit 56, and position corrector circuit 100 in the CRO of FIG. 1. The vertical deflection circuit 50 comprises, in addition to the aforesaid vertical raster scan signal generator 96:

1. A preamplifier 106 having a first input connected to the signal input terminal 54 and a second input connected to a conventional vertical position adjuster 108.

2. A delay circuit 110 connected to a pair of outputs of the preamplifier 106 for introducing a time delay of approximately 100 nanoseconds (ns).

3. An output amplifier 112 to be selectively connected to the pair of ouitputs of the vertical raster scan signal generator 96 and to the pair of outputs of the delay circuit 110 via a selector switch 114.

The vertical deflection circuit 50 of the above configuration is akin to the corresponding circuit in the familiar CRO (i.e. the one having no storage tube) except for the addition of the vertical raster scan signal generator 96 and selector switch 114. We will therefore describe only these vertical raster scan signal genrator and selector switch in further detail.

The vertical raster scan signal generator 96 produces and delivers along its pair of output lines 116 a vertical deflection signal in the form of a sawtooth wave for raster scanning, a process very similar to vertical scanning in an ordinary television set. The sawtooth vertical deflection signal generated by the generator 96 is plotted in FIG. 4A. Its frequency may be 60 hertz (Hz). Further the vertical raster scan signal generator 96 puts out a gate signal (Z axis signal) along its output line 92 connected to the AND gate 72, FIG. 1, of the beam control circuit 60. As plotted in FIG. 4B, this gate signal takes the form a rectangular wave with a pulse duration corresponding to each vertical scanning period of FIG. 4A.

The selector switch 114 has a pair of ganged movable contacts 118 coupled to the output amplifier 112. These movable contacts are selectively engageable with a first pair of fixed contacts 120 connected to the delay circuit 110 and with a second pair of fixed contacts 122 connected to the vertical raster scan signal generator 96 by way of its output lines 116. Upon engagement of the movable contact pair 118 with the first fixed contact pair 120 the vertical deflection circuit 50 is set in the write mode, such that the input waveform is introduced into the storage tube 10 as well as into the CRT 12. The engagement of the movable contact pair 118 with the second fixed contact pair 122, on the other hand, conditions the vertical deflection circuit 50 for the read mode (the extraction of information from the storage tube 10 for display on the CRT screen 36) or for the erase mode (the removal of information from the storage tube target 14).

The horizontal deflection circuit 56 comprises, in addition to the aforesaid horizontal raster scan signal generator 98:

1. A trigger circuit 124 for producing a trigger signal in response to the output from the preamplifier 106 of the vertical deflection circuit 50.

2. A sweep generator 126 for producing a horizontal deflection signal in the form of a sawtooth wave, for delivery along an output line 128, in response to the trigger signal from the trigger circuit 124.

3. A preamplifier 130 having a first input connected to the sweep generator 126 via its output line 128 and a second input connected to a horizontal position adjuster 132.

4. An output amplifier 134 to be selectively connected to the pair of outputs of the preamplifier 130 and to the pair of outputs of the horizontal raster scan signal generator 98 by a selector switch 136.

Except for the horizontal raster scan signal generator 98 and selector switch 136, the above configuration of the horizontal deflection circuit 56 is similar to that of the corresponding circuit in the standard CRO having no waveform storage function.

During the delivery of the input waveform from the vertical deflection circuit 50 to the storage tube 10 and CRT 12, the sweep generator 126 of the horizontal deflection circuit 56 applies the sawtooth horizontal deflection or sweep voltage, shown in FIG. 3A, to one of the inputs of the preamplifier 130. Also the sweep generator 126 delivers along its output line 74 leading to the beam control circuit 60 a gate or unblanking signal (Z axis signal) in the form of a rectangular wave with a pulse duration corresponding to each horizontal sweep period of FIG. 3A. Included in the sweep generator 126 is a sweep speed selector switch 138, as has been known heretofore, which offers a choice from among several different sweep speeds. Changes in sweep speed are effected by varying the slopes of the rises of the sawtooth output voltage of the generator 126.

Having an input connected to the vertical raster scan signal generator 96 of the vertical deflection circuit 50, the horizontal raster scan signal generator 98 produces a horizontal deflection signal in the form of a sawtooth wave in synchronism with the sawtooth vertical deflection signal, for the purpose of raster scan which is analogous with horizontal scanning in an ordinary television set. FIG. 5A shows the horizontal deflection signal put out by the horizontal raster scan signal generator 98 for delivery along a pair of output lines 140. Its frequency may be 15.75 kHz. Further the horizontal raster scan signal generator 98 produces a gate signal for delivery along its other output line 94 leading to the AND gate 72, FIG. 1, of the beam control circuit 60. As plotted in FIG. 5B, the gate signal takes the form of a rectangular wave with a pulse duration corresponding to each horizontal scanning period determined by the horizontal deflection signal of FIG. 5A.

The selector switch 136 has a pair of ganged movable contacts 142 connected to the output amplifier 134, a first pair of fixed contacts 144 connected to the preamplifier 130, and a second pair of fixed contacts 146 connected to the horizontal raster scan signal generator 98 by way of its output lines 140. The movable contact pair 142 is to be engaged with the first fixed contact pair 144 for the write mode and with the second fixed contact pair 146 for the read and erase modes.

The position corrector circuit 100 comprises the following elements:

1. A parallel connection of four resistors 148, 150, 152 and 154 for the selective delivery of a correction signal proportionate with the selected sweep speed.
2. A selector switch 156 ganged with the sweep speed selector switch 138 of the horizontal sweep generator 126 for selective engagement with the resistors 148, 150, 152 and 154.
3. A grounded-base PNP transistor 158 for the supply of the correction current as determined by any selected one of the resistors 148, 150, 152 and 154.
4. A resistor 160 for compensating for a delay in waveform transfer from storage tube 10 to CRT 12.
5. A variable resistor 162 for the adjustment of the maximum degree of correction to be made by the position corrector circuit 100.

Each of the four resistors 148, 150, 152 and 154 has one extremity coupled to the power supply 104 via the switch 102 and another extremity to one fixed contact of the selector switch 156. The selector switch 156 connects any selected one of these four resistors to the emitter of the transistor 158. The collector of this transistor is connected to one extremoty of the variable resistor 162, the other extremity of which is grounded. The resistor 160 is connected between the one extremity of the variable resistor 162 and the switch 102. The variable resistor 162 has its movable contact 164 connected via a resistor 166 to one of the two inputs of the preamplifier 130, which is an operational amplifier, of the horizontal deflection circuit 56. To the same input of the preamplifier 130 there is connected the potentiometric horizontal position adjuster 132 via another resistor 168.

The four resistors 148, 150, 152 and 154 of the position corrector circuit 100, to be selectively engaged by the selector switch 156, do not correspond to alll the sweep speed to be offered by the sweep generator 126 with the built-in sweep speed selelctor switch 138, but only to the higher sweep speeds. An additional resistor or resistors might of course be used for a lower sweep speed or speeds. However, the difference between the waveform positions on the CRT screen presents no serious problem at low sweep speed, as will be better understood as the description proceeds.

It is very difficult to make exactly the same the center-to-center distance between the vertical deflection plate pair 24 and horizontal deflection plate pair 26 of the storage tube 10 and the center-to-center distance between the vertical deflection plate pair 46 and horizontal deflection plate pair 48 of the CRT 12. We will now discuss the problem arising from this difficulty in more detail.

With reference to FIG. 6, let $L_1$ be the center-to-center distance between the vertical deflection plate pair 24 and horizontal deflection plate pair 26 of the storage tube. Also, in FIG. 7, let $L_2$ be the center-to-center distance between the vertical deflection plate pair 46 and horizontal deflection plate pair 48 of the CRT. The length of time $t_1$ required for the electron beam to traverse the distance $L_1$ is given by $$t_1 = K \frac{L_1}{\sqrt{Vk_1}}$$

where $Vk_1$ = the accelerating voltage of the storage tube 10, and $$K = \sqrt{\frac{m}{2e}}$$

where m = the electron mass, and e = the electron charge.

The length of time $t_2$ required for the electron beam to traverse the distance $L_2$, on the other hand, is defined as $$t_2 = K \frac{L_2}{\sqrt{Vk_2}}$$

where $Vk_2$ = the accelerating voltage of the CRT 12.

Accordingly, if $L_1$ = 12.5 millimeters (mm), $L_2$ = 65 mm, $Vk_1$ = 1 kV, and $Vk_2$ = 2.5 kV, then $t_1 \approx 0.67$ ns, and $t_2 \approx 2.19$ ns. There is a difference of as much as 1.52 ns between $t_1$ and $t_2$.

Let it be supposed that the vertical 24 and horizontal 26 deflection plate pairs of the storage tube 10 and the vertical 46 and horizontal 48 deflection plate pairs of the CRT 12 are energized under the same conditions by the output amplifiers 112 and 134 of the vertical 50 and horizontal 56 deflection circuits. Then, in the storage tube 10, the electron beam will be deflected by the horizontal deflection plate pair 26 upon lapse of 0.67 ns after having been deflected by the vertical deflection plate pair 24. In the CRT 12, on the other hand, the electron beam will be deflected by the horizontal deflection plate pair 48 upon lapse of 2.19 ns after having been deflected by the vertical deflection plate pair 46.

This difference between the moments when the electron beams undergo horizontal deflections in the storage tube 10 and CRT 12 results in a corresponding difference between the horizontal positions of the waveform written on the storage tube target 14 and the waveform displayed on the CRT screen 36. In the above assumed case the waveform position on the storage tube target 14 will be approximately 1.5 ns displaced to the left (advanced in phase) with respect to the waveform position on the CRT screen 36. The 1.5 ns displacement is equivalent to that of 0.75 division (div) on the CRT screen 36 if the sweep speed is 2 ns/div. The waveform written on the storage tube target 14 with the 0.75 div displacement will, if subsequently read out and displayed on the CRT screen 36, still have the 0.75 div displacement with respect to the waveform direct from the signal input terminal 54.

Our improved CRO with the position corrector circuit 100 overcomes this problem. How it does so will become apparent from the subsequent description of operation.

The almost unavoidable difference between the center-to-center distance $L_1$ between the vertical 24 and horizontal 26 deflection plate pairs of the storage tube 10 and the center-to-center distance $L_2$ between the vertical 46 and horizontal 48 deflection plate pairs of the CRT 12 affects, of course, the readout of the waveform from the storage tube 10 and subsequent display on the CRT screen 36. The waveform displacement in that case is, however, negligible as the speed of horizontal deflection (sweep) for readout is as low as, say, 6 μs/div.

We are aware of another cause of displacement in the display position of the waveform transferred from storage tube 10 to CRT 12. During waveform transfer from storage tube to CRT the amplifier 88, which is a video amplifier, with a built-in noise filter, the second Z axis amplifier 68, etc., introduce in combination a time delay of approximately 200-300 ns.

FIGS. 8A through 8D are explanatory of how the waveform read from the storage tube 10 is displayed displaced on the CRT screen 36 by reason of the above time delay caused while the signal journeys from storage tube to CRT. Depicted in FIG. 8A is an example of waveform 170 written on the storage tube target 14. As the scanning line 172 due to the horizontal deflection voltage of FIG. 8B reads out the waveform 170, there is obtained the video signal of FIG. 8C. FIG. 8D plots the same signal subsequently put out by the second Z axis amplifier 68 of the beam control circuit 60 for application to the control grid 44 of the CRT 12. The output signal of the second Z axis amplifier 68 has a time delay $t_D$ with respect to the FIG. 8C signal. Thus the waveform 170 is displayed on the CRT screen 36 as displaced to the right to an extent corresponding to the time delay $t_D$. The displacement will be approximately 0.05 div if the horizontal scanning speed is 6 μs/div.

This waveform displacement on the CRT screeen is so small that it may be ignored for most practical purposes. For the observation or measurement of waveforms with high precision, however, the displacement should be eliminated. It is to this end that the position corrector circuit 100, FIG. 2, includes the resistor 160.

OPERATION

Direct Display on CRT Screen

A train of pulses with a high repetition rate, for instance, may first be observed directly on the CRT screen 36. For this purpose the various switches seen in FIGS. 1 and 2 are activated as follows:

1. The movable contact pair 118 of the selector switch 114 in the vertical deflection circuit 50 is engaged with the fixed contact pair 120.
2. The movable contact pair 142 of the selector switch 136 in the horizontal deflection circuit 56 is engaged with the fixed contact pair 144.
3. The movable contact 76 of the selector switch 64 in the beam control circuit 60 is engaged with the fixed contact 78.
4. The movable contact 82 of the selector switch 70 in the beam control circuit 60 is engaged with the fixed contact 84.
5. The on-off switch 66 in the beam control circuit 60 is opened.
6. The on-off switch 102 between position corrector circuit 100 and power supply 104 is opened.

Further the sweep speed selector switch 138 built into the sweep generator 126 in the horizontal deflection circuit 56 is activated to choose a desired sweep speed. This activation of the sweep speed selector switch 138 results in the engagement of the selector switch 156 in the position corrector circuit 100 with the corresponding one of the resistors 148, 150, 152 and 154. In the present case, however, the position corrector circuit 100 puts out no correction signal since its power switch 102 is off.

With the various switches activated as above, the CRO operates just like the familiar CRO to display on the CRT screen 36 the waveform supplied through the signal input terminal 54. The circuit comprising the signal input terminal 54, preamplifier 106, delay circuit 110, and output amplifier 112, all included in the vertical deflection circuit 50, produces a vertical deflection voltage derived from and representative of the input waveform. This vertical deflection voltage is impressed to the CRT vertical deflection plate pair 46.

Simultaneously the circuit comprising the sweep generator 126, preamplifier 130, and output amplifier 134, all included in the horizontal deflection circuit 56, produces the sawtooth horizontal deflection voltage for application to the CRT horizontal deflection plate pair 48. Further the sweep generator 126 delivers its output along the line 74 to the second Z axis amplifier 68 in the beam control circuit 60, thereby causing same to apply the unblanking signal to the CRT control grid 44.

Thus the CRT 12 displays the input waveform on its screen 36. The vertical and horizontal deflection signals are of course applied to the storage tube 10 concurrently with their application to the CRT 12. However, since the on-off switch 66 in the beam control circuit 60 is now held open as aforesaid, the electron gun 18 of the storage tube is unable to emit the electron beam.

WRITING ONTO STORAGE TUBE

For writing the input waveform onto the storage tube 10 the switches 114, 136, 64 and 70 may be activated just as in the above described case of direct waveform display on the CRT screen 36. However, the power switch 102 of the position corrector circuit 100 must be closed to set that circuit into operation. The on-off switch 66 in the beam control circuit 60 is also closed to connect the output line 74 of the sweep generator 126 to the first Z axis amplifier 62 coupled to the storage tube control grid 22. Further the movable contact 174 of the supply switch 28, FIG. 1 is engaged with its first fixed contact 176 to connect the first power supply 30 to the storage tube target 14. We assume that the storage tube target 14 has been erased.

Upon introduction of the input waveform through the signal input terminal 54 the output amplifier 112 of the vertical deflection circuit 50 produces a vertical deflection voltage derived from and representative of the input waveform. This vertical deflection voltage is impressed to the storage tube vertical deflection plate pair 24. The output amplifier 134 of the horizontal deflection circuit 56 applies the sawtooth horizontal deflection voltage to the storage tube horizontal deflection plate pair 26. Further the sweep generator 126 of the horizontal deflection circuit 56 delivers its output to the first Z axis amplifier 62 of the beam control circuit 60 via the switches 64 and 66. Thereupon the amplifier 62 applies the required voltage to the storage tube control grid 22 for beam emission by the electron gun 18. Thus, in the storage tube 10, the electron beam from the gun 18 scans the storage target 14 much the same wasy as in the CRT 12 to write the input waveform thereon.

Since the power switch 102 of the position corrector circuit 100 has been closed as above, this circuit delivers a correction current, corresponding in magnitude to the selected sweep speed, to one of the inputs of the preamplifier 130 in the horizontal deflection circuit 56. The correction current is added to the sawtooth horizontal deflection current (sweep signal) fed to the other input of the preamplifier 130 from the sweep generator 126.

Consequently the horizontal deflection circuit 56 puts out such a horizontal deflection voltage as to eliminate the difference between the waveform positions on the storage tube target 14 and CRT screen 36 that has been explained with reference to FIGS. 6 and 7 and FIGS. 8A through 8D. The output voltage from the horizontal deflection circuit 56 is such that the input waveform is written on the storage tube target 14 as shifted to the right to such an extent that the horizontal position of the waveform thereon coincides with that of the waveform displayed directly on the CRT screen 36.

The CRT 12 is of course being driven during the writing of the input waveform onto the storage tube 10. This same waveform is therefore also displayed on the CRT screen 36.

READOUT FROM STORAGE TUBE FOR DISPLAY ON CRT SCREEN

The various switches of FIGS. 1 and 2 may be actuated as follows for reading the waveform from the storage tube 10 and for displaying it on the CRT screen 36:

1. The movable contact pair 118 of the selector switch 114 in the vertical deflection circuit 50 is engaged with the fixed contact pair 122.

2. The movable contact pair 142 of the selector switch 136 in the horizontal deflection circuit 56 is engaged with the fixed contact pair 146.

3. The movable contact 76 of the selector switch 64 in the beam control circuit 60 is engaged with the fixed contact 80.

4. The movable contact 82 of the selector switch 70 in the beam control circuit 60 is engaged with the fixed contact 86.

5. The on-off switch 66 in the beam control circuit 60 is closed.

6. The power switch 102 of the position corrector circuit 100 is opened.

7. The movable contact 174 of the supply switch 28 is engaged with its second fixed contact 178 to connect the second power supply 32 to the storage tube target 14.

As the vertical raster scan signal generator 96 is connected as above to the output amplifier 112, the vertical deflection circuit 50 puts out a sawtooth vertical deflection voltage, akin to the vertical scanning signal in a television set, for application to both vertical deflection plate pairs 24 and 46 of the storage tube 10 and CRT 12. Also, with the horizontal raster scan signal generator 98 connected to the output amplifier 134, the horizontal deflection circuit 56 produces a sawtooth horizontal deflection voltage, similar to the horizontal scan signal in a television set, for application to both horizontal deflection plate pairs 26 and 48 of the storage tube 10 and CRT 12. Consequently the storage tube 10 and CRT 12 have their electron beams deflected synchronously.

The vertical raster scan signal generator 96 in the vertical deflection circuit 50 and the horizontal raster scan signal generator 98 in the horizontal deflection circuit 56 further deliver the gate signals of FIGS. 4B and 5B to the AND gate 72 in the beam control circuit 60. The AND gate 72 produces an output representative of the logical product of the input gate signals. Since the movable contact 76 of the selector switch 64 is now engaged with the fixed contact 80, and since the on-off switch 66 is closed, the output from the AND gate 72 is applied to the first Z axis amplifier 62 and thence to the storage tube control grid 22. Accordingly the storage tube electron gun 18 emits the electron beam only during the horizontal scanning periods during each vertical scanning period.

The consequent raster scanning of the storage tube target 14 by the electron beam results in the readout of the stored waveform. The signal representative of the extracted waveform is fed to the CRT control grid 44 along the path comprising the capacitor 90, amplifier 88, switch 82, and second Z axis amplifier 68, for use as the unblanking signal (Z axis signal) of the CRT 12. The result is the display of the extracted waveform on the CRT screen 36.

ERASING OF INFORMATION FROM STORAGE TUBE

The following switch actuations are required for erasing the stored waveform from the storage tube target 14:

1. The movable contact pair 118 of the selector switch 114 in the vertical deflection circuit 50 is engaged with the fixed contact pair 122.

2. The movable contact pair 142 of the selector switch 136 in the horizontal deflection circuit 56 is engaged with the fixed 3. The movable contact 76 of the selector switch 64 in the beam control circuit 60 is engaged with the fixed contact 80.

4. The on-off switch 60 in the beam control circuit 60 is closed.

5. The movable contact 174 of the supply switch 28 is engaged with its third fixed contact 180 to connect the third power supply 34 to the storage tube target 14.

Then the storage tube target 14 may be raster scanned by the electron beam from the gun 18.

The foregoing will have made clear how we have succeeded in minimizing the difference between the horizontal positions on the CRT screen 36 of the waveform direct from the signal input terminal 54 and of the waveform read from the storage tube 10, due to the two reasons given previously. The correction current from the position corrector circuit 100 is combined with the horizontal deflection current from the sweep generator 126 for writing the input waveform in a horizontally shifted position on the storage tube target 14. The horizontal shifting of the stored waveform is such that when subsequently read from the storage tube 10 and displayed on the CRT screen 36, the waveform occupies substantially the same position thereon as it would if it were introduced into the CRT 12 directly from the signal input terminal 54.

We have designed the position corrector circuit 100 so that its output current corresponds in magnitude to at least the higher ones of several different sweep speeds offered by the sweep speed selector switch 138. Thus, at practically any selected sweep speed, the position corrector circuit 100 can reduce the difference between the horizontal positions of the direct and indirect waveforms on the CRT screen 36 to an absolute minimum.

FIRST ALTERNATE EMBODIMENT

Figure 9:
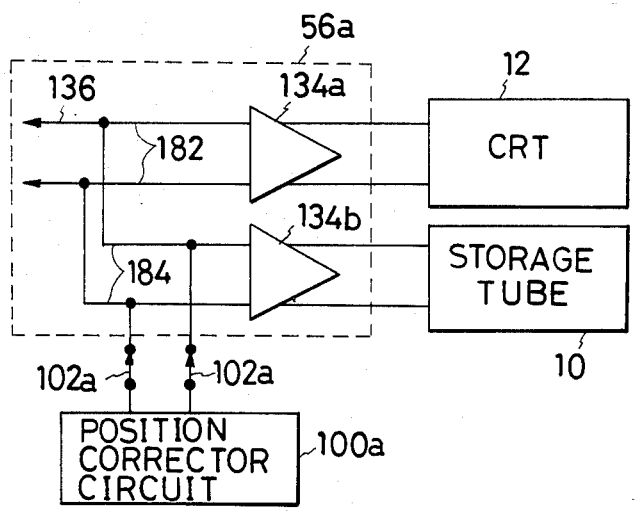
FIG. 9 is a schematic electrical diagram of a modified horizontal deflection circuit for use in the CRO of our invention.

FIG. 9 shows an alternate embodiment of our invention including a modified horizontal deflection circuit 56a which has two output amplifiers 134a and 134b coupled respectively to the CRT 12 and storage tube 10. Both output amplifiers 134a and 134b have their pairs of input lines 182 and 184 coupled to the preamplifier 130 via the selector switch 136 as in FIG. 2. A position corrector circuit 100a of correspondingly modified configuration is connected between the pair of input lines 184 of the differential output amplifier 134b via a pair of on-off switches 102a. These switches are to be closed only when the CRO is in the write mode, allowing the delivery of the output signal from the position corrector circuit 100a to the output amplifier 134b and thence to the storage tube 10.

Figure 10:
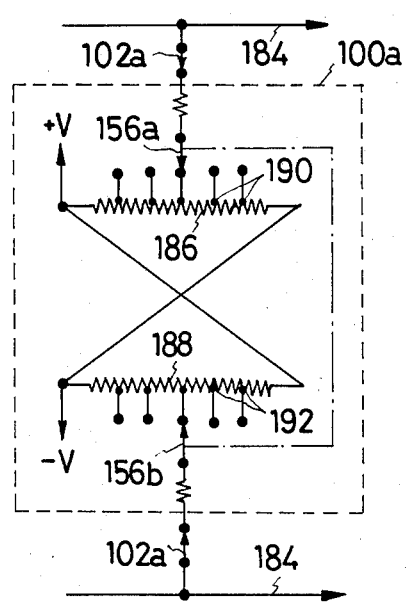
FIG. 10 is a schematic electrical diagram of a modified position corrector circuit for use with the modified horizontal deflection circuit of FIG. 9.

FIG. 10 is a detailed representation of an example of position corrector circuit 100a suitable for use with the modified horizontal deflection circuit 56a of FIG. 9. The modified position corrector circuit 100a includes a pair of resistors 186 and 188, each having a plurality of taps 190 and 192, connected between positive and negative supply terminals designated +V and −V. A pair of ganged selector switches 156a and 156b selectively connect the taps 190 and 192 to the input lines 184 of the output amplifier 134b via the switches 102a respectively. The selector switches 156a and 156b are of course interlocked with the sweep speed selector switch 138, FIG. 2.

SECOND ALTERNATE EMBODIMENT

Figure 11:
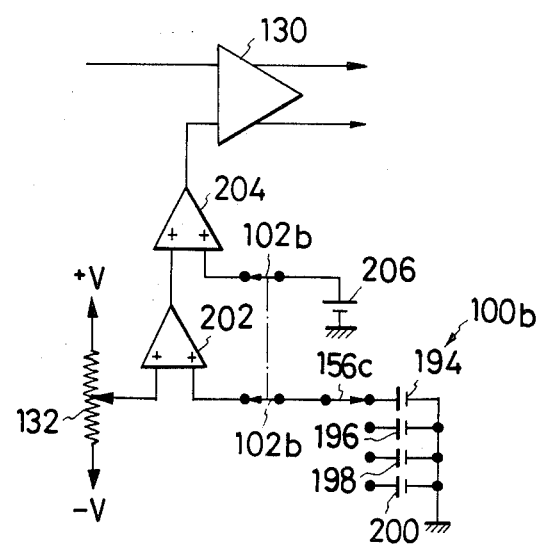
FIG. 11 is a schematic electrical diagram of another modified position corrector circuit in accordance with our invention.

We recognize that the positional difference between the waveforms displayed directly and via the storage tube, respectively, on the CRT screen is correctable by voltage control, instead of by current control as in the two foregoing embodiments. Thus, in FIG. 11, another modified position corrector circuit 100b includes a set of four different voltage sources 194, 196, 198 and 200 to be selectively connected to one of the inputs of an adder 202 via a selector switch 156c and another switch 102b. The selector switch 156c is interlocked with the sweep speed selector switch 138, FIG. 2, for providing a correction voltage corresponding to the selected sweep speed.

The horizontal position adjuster 132 is connected to the other input of the adder 202. The output from this adder is therefore equal to the sum of the voltage from the selected one of the voltage sources 194 through 200 and the voltage from the horizontal position adjuster 132.

The output of the adder 202 is connected to one of the inputs of a second adder 204. An additional voltage source 206 is connected to the other input of the second adder 204 via a switch 102b ganged with the aforesaid switch 102b connected ahead of the first receited adder 202. The additional voltage source 206 is intended for the correction of the waveform displacement due to the reason set forth in conjunction with FIGS. 8A through 8D.

Such being the configuration of the second alternate position corrector circuit 100b, the output from the second adder 204 constitutes the required correction voltage for application to one of the inputs of the preamplifier 130 in the horizontal deflection circuit 56. It is understood that the other input of the preamplifier 130 receives a sawtooth voltage from the sweep generator 126.

MODIFICATIONS

Although we have shown and described our invention in terms of specific embodiments thereof, it is understood that these are by way of example only, since a variety of modifications or alterations will readily occur to the specialists on the basis of this disclosure. For example, the input waveform need not be shifted to the right, or in the direction of phase lag, while being written on the storage tube target as in the disclosed embodiments. As an obvious alternative a correction signal may be added to the sawtooth sweep signal when the input waveform is introduced directly into the CRT for display, thereby shifting the waveform to the left, or in the direction of phase advance, on the CRT screen. This alternative scheme makes unnecessary the shifting of the waveform position on the storage tube target. Further, instead of the single output amplifier 112 of the vertical deflection circuit 50, two amplifiers might be provided, one for the storage tube and the other for the CRT.

All these and other modifications within the usual knowledge of one skilled in the art are understood to fall within the scope of our invention as expressed in the following claims.

We claim:

1. A cathode ray oscilloscope with a waveform storage capability, comprising:
 (a) a signal input;
 (b) a scan converter storage tube for storing a waveform received from the signal input, the scan converter storage tube comprising:
  (1) a storage target;

(2) an electron gun for emitting an electron beam directed toward the storage target;

(3) a first pair of deflection plates for deflecting the electron beam from the electron gun in a first direction; and (4) a second pair of deflection plates for deflecting the electron beam from the electron gun in a second direction, the first and second directions being at right angles with each other;

(c) a cathode ray tube for displaying the waveform received either directly from the signal input or via the scan converter storage tube, the cathode ray tube comprising:

(1) a display screen;

(2) an electron gun for emitting an electron beam directed toward the display screen;

(3) a first pair of deflection plates for deflecting the electron beam from the electron gun of the cathode ray tube in the first direction; and (4) a second pair of deflection plates for deflecting the electron beam from the electron gun of the cathode ray tube in the second direction;

(d) a first deflection circuit for applying a deflection voltage in the first direction, representative of the input waveform, at least to the first pair of deflection plates of the cathode ray tube in displaying the input waveform directly on the display screen of the cathode ray tube and at least to the first pair of deflection plates of the scan converter storage tube in writing the input waveform on the storage target of the scan converter storage tube, and for applying a deflection voltage in the first direction both to the first pair of deflection plates of the scan converter storage tube and to the first pair of deflection plates of the cathode ray tube for the purpose of raster scan in reading the waveform from the storage target of the scan converter storage tube and displaying the waveform on the display screen of the cathode ray tube;

(e) a second deflection circuit for applying a sawtooth deflection voltage in the second direction at least to the second pair of deflection plates of the cathode ray tube in displaying the input waveform directly on the display screen of the cathode ray tube and at least to the second pair of deflection plates of the scan converter storage tube in writing the input waveform on the storage target of the scan converter storage tube, and for applying a deflection voltage in the second direction both to the second pair of deflection plates of the scan converter storage tube and to the second pair of deflection plates of the cathode ray tube for the purpose of raster scan in reading the waveform from the storage target of the scan converter storage tube and displaying the waveform on the display screen of the cathode ray tube;

(f) sweep speed selector means associated with the second deflection circuit for selecting a speed at which the electron beams are swept in the second direction in the scan converter storage tube and the cathode ray tube in response to the sawtooth deflection voltage;

(g) a beam control circuit for applying an intensity signal to the electron gun of the cathode ray tube in displaying the input waveform directly on the display screen of the cathode ray tube, for applying a signal to the electron gun of the scan converter storage tube to cause the same to emit the electron beam in writing the input waveform on the storage target of the scan converter storage tube, and, in reading the waveform from the storage target of the scan converter storage tube and displaying the waveform on the display screen of the cathode ray tube, for applying an intensity signal representative of the waveform being read from the scan converter storage tube to the electron gun of the cathode ray tube; and (h) a position corrector circuit associated with the sweep speed selector means for producing a correction signal in proportion with the selected sweep speed in order to eliminate the difference between the positions in the second directions of the input waveform displayed on the display screen of the cathode ray tube directly from the signal input and of the waveform displayed thereon after having been stored in the scan converter storage tube, the position corrector circuit delivering the correction signal to the second deflection circuit.

2. The cathode ray oscilloscope of claim 1 wherein the second deflection circuit comprises:

(a) a sweep generator including the sweep speed selector means for producing a sawtooth sweep signal having a characteristic representative of the sweep speed selected by the sweep speed selector means;

(b) a preamplifier for amplifying the sawtooth sweep signal from the sweep generator;

(c) a raster scan signal generator for producing a raster scan signal;

(d) output amplifier means for selectively amplifying the sawtooth sweep signal from the preamplifier and the raster scan signal from the raster scan signal generator for application to the second pair of deflection plates of the scan converter storage tube and/or to the second pair of deflection plates of the cathode ray tube; and (e) a selector switch for connecting the preamplifier to the output amplifier means in displaying the input waveform directly on the display screen of the cathode ray tube and in writing the input waveform on the storage target of the scan converter storage tube and for connecting the raster scan signal generator to the output amplifier means in reading the waveform from the storage target of the scan converter storage tube and displaying the waveform on the display screen of the cathode ray tube and in erasing the information from the storage target.

3. The cathode ray oscilloscope of claim 2 wherein the correction signal from the position corrector circuit is added to the sawtooth sweep signal from the sweep generator of the second deflection circuit.

4. The cathode ray oscilloscope of claim 3 wherein the position corrector circuit comprises:

(a) a set of resistors for providing correction signals corresponding to at least some of the predetermined different sweep speeds of which any one is to be selected by the sweep speed selector means of the sweep generator;

(b) a selector switch responsive to the actuation of the sweep speed selector means for selecting one of the resistors, if any, corresponding to the selected sweep speed; and (c) an on-off switch for allowing the delivery of the correction signal corresponding to the selected resistor to the second deflection circuit for addition to the sawtooth sweep signal from the sweep generator only when the input waveform is being written on the storage target of the scan converter storage tube.

5. The cathode ray oscilloscope of claim 2 wherein the output amplifier means of the second deflection circuit comprises:
 (a) a first output amplifier connected to the second pair of deflection plates of the scan converter storage tube; and
 (b) a second output amplifier conected to the second pair of deflection plates of the cathode ray tube.

6. The cathode ray oscilloscope of claim 5 wherein the position corrector circuit is connected ahead of the first output amplifier of the second deflection circuit.

7. The cathode ray oscilloscope of claim 6 wherein the first output amplifier of the second deflection circuit is a differential amplifier having a pair of input lines connected thereto, and the position corrector circuit is connected between the pair of input lines of the first output amplifier.

8. The cathode ray oscilloscope of claim 1 wherein the correction signal produced by the position corrector circuit is in the form of a voltage.

* * * * *